(12) United States Patent　(10) Patent No.: US 11,699,651 B2
Plavidal et al.　(45) Date of Patent: Jul. 11, 2023

(54) FAN-OUT INTERCONNECT INTEGRATION PROCESSES AND STRUCTURES

(71) Applicant: Applied Materials, Inc., Santa Clara, CA (US)

(72) Inventors: Richard W. Plavidal, Kalispell, MT (US); Albert Lan, Hsinchu (TW)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/167,032

(22) Filed: Oct. 22, 2018

(65) Prior Publication Data

US 2019/0122981 A1　Apr. 25, 2019

Related U.S. Application Data

(60) Provisional application No. 62/575,977, filed on Oct. 23, 2017.

(51) Int. Cl.
   *H01L 23/522*　(2006.01)
   *H01L 23/00*　(2006.01)
   (Continued)

(52) U.S. Cl.
   CPC .... *H01L 23/5226* (2013.01); *H01L 21/76841* (2013.01); *H01L 23/3731* (2013.01);
   (Continued)

(58) Field of Classification Search
   CPC .................................................. H01L 23/5226
   See application file for complete search history.

(56) References Cited

U.S. PATENT DOCUMENTS 5,514,613 A * 5/1996 Santadrea ........... H01L 21/6835
　　　　　　　　　　　　　　　　257/E21.525
2006/0121690 A1　6/2006 Pogge et al.
(Continued)

FOREIGN PATENT DOCUMENTS

KR　2016-0085197 A　7/2016
KR　2017-0077133 A　7/2017
(Continued)

OTHER PUBLICATIONS

PCT/US2018/056845, "International Search Report and Written Opinion", dated Feb. 8, 2019, 12 pages.
(Continued)

*Primary Examiner* — Mohammad M Choudhry
(74) *Attorney, Agent, or Firm* — Kilpatrick Townsend & Stockton LLP (57) ABSTRACT

Processing methods may be performed to form a fan-out interconnect structure. The methods may include forming a semiconductor active device structure overlying a first substrate. The semiconductor active device structure may include first conductive contacts. The methods may include forming an interconnect structure overlying a second substrate. The interconnect structure may include second conductive contacts. The methods may also include joining the first substrate with the second substrate. The joining may include coupling the first conductive contacts with the second conductive contacts. The interconnect structure may extend beyond the lateral dimensions of the semiconductor active device structure.

20 Claims, 10 Drawing Sheets

(51) Int. Cl.
  *H01L 21/768* (2006.01)
  *H01L 23/373* (2006.01)
  *H01L 23/532* (2006.01)
  *H01L 25/00* (2006.01)
  *H01L 25/065* (2023.01)

(52) U.S. Cl.
  CPC .......... *H01L 23/3732* (2013.01); *H01L 24/03* (2013.01); *H01L 24/09* (2013.01); *H01L 24/11* (2013.01); *H01L 24/81* (2013.01); *H01L 23/53295* (2013.01); *H01L 24/13* (2013.01); *H01L 24/16* (2013.01); *H01L 25/0655* (2013.01); *H01L 25/50* (2013.01); *H01L 2224/0231* (2013.01); *H01L 2224/02379* (2013.01); *H01L 2224/0401* (2013.01); *H01L 2224/05548* (2013.01); *H01L 2224/05647* (2013.01); *H01L 2224/05657* (2013.01); *H01L 2224/05684* (2013.01); *H01L 2224/11009* (2013.01); *H01L 2224/11845* (2013.01); *H01L 2224/13022* (2013.01); *H01L 2224/13024* (2013.01); *H01L 2224/13147* (2013.01); *H01L 2224/13157* (2013.01); *H01L 2224/13184* (2013.01); *H01L 2224/16237* (2013.01); *H01L 2224/16238* (2013.01); *H01L 2224/8113* (2013.01); *H01L 2224/81411* (2013.01); *H01L 2224/81416* (2013.01); *H01L 2224/81815* (2013.01); *H01L 2224/94* (2013.01); *H01L 2924/351* (2013.01)

(56) References Cited

U.S. PATENT DOCUMENTS

| | | | |
|---|---|---|---|
| 2007/0284602 | A1 | 12/2007 | Chitnis et al. |
| 2008/0315407 | A1* | 12/2008 | Andrews, Jr. ....... H01L 25/0657 257/777 |
| 2011/0215478 | A1 | 9/2011 | Yamamichi et al. |
| 2013/0175699 | A1* | 7/2013 | Haba ...................... H01L 24/96 257/774 |
| 2015/0259194 | A1 | 9/2015 | Lin et al. |
| 2016/0126173 | A1* | 5/2016 | Kim .................. H01L 23/49816 257/738 |
| 2016/0372395 | A1 | 12/2016 | Shih et al. |
| 2017/0098634 | A1* | 4/2017 | Kumar .................. H01L 25/105 |
| 2017/0133336 | A1* | 5/2017 | Oliver ............... H01L 21/02063 |

FOREIGN PATENT DOCUMENTS

| | | |
|---|---|---|
| TW | 2007-33333 A | 9/2007 |
| TW | 2017-01406 A | 1/2017 |
| TW | 2017-25685 A | 7/2017 |
| WO | 2017-176020 | 10/2017 |

OTHER PUBLICATIONS

International Preliminary Report on Patentability dated May 7, 2020 in related application No. PCT/US2018/056845, 9 pgs.

* cited by examiner

FAN-OUT INTERCONNECT INTEGRATION PROCESSES AND STRUCTURES

CROSS-REFERENCE TO RELATED APPLICATIONS

This application claims a priority to and benefits of U.S. Provisional Patent Application 62/575,977, filed Oct. 23, 2017, the contents of which are hereby incorporated by reference in its entirety for all purposes.

TECHNICAL FIELD

The present technology relates to semiconductor systems, processes, and devices. More specifically, the present technology relates to methods and devices for producing fan-out interconnect structures.

BACKGROUND

Integrated circuits are made possible by processes which produce intricately patterned material layers on substrate surfaces. As integrated circuits continue to shrink to accommodate smaller end devices, the back end metallization of these integrated circuits becomes more intricate. For example, as interconnects shrink in size, they increase in resistance, which can impact device performance. Although some technologies have developed to attempt to improve metallization, device footprint continues to dictate many aspects of interconnect formation and device performance.

Thus, there is a need for improved systems and methods that can be used to produce high quality devices and structures. These and other needs are addressed by the present technology.

SUMMARY

Processing methods may be performed to form a fan-out interconnect structure. The methods may include forming a semiconductor active device structure overlying a first substrate. The semiconductor active device structure may include first conductive contacts. The methods may include forming an interconnect structure overlying a second substrate. The interconnect structure may include second conductive contacts. The methods may also include joining the first substrate with the second substrate. The joining may include coupling the first conductive contacts with the second conductive contacts. The interconnect structure may extend beyond the lateral dimensions of the semiconductor active device structure.

In some embodiments, the semiconductor active device structure may include a metallization layer overlying semiconductor active device layers. The interconnect structure may include global interconnects formed within a plurality of layers of dielectric material. The interconnect structure may be formed as a reverse process in which a final global interconnect layer is formed prior to a semi-global or intermediate interconnect layer. The first conductive contacts may include a plurality of conductive studs extending from a first surface of the semiconductor active device structure opposite a second surface adjacent the first substrate. A first surface of the interconnect structure opposite a second surface coupled with the second substrate may define a plurality of access vias. Each access via may be characterized by a taper from the first surface of the interconnect structure. Each access via may contain a conductive liner. The second conductive contacts may include a conductive filler contained within the plurality of access vias. In some embodiments, the joining may further include contacting the conductive filler contained within the plurality of access vias with the plurality of conductive studs. The joining may also include heating the conductive filler to cause the conductive filler to melt and flow about the conductive studs to electrically couple the conductive filler with the conductive studs.

The second conductive contacts may include a plurality of conductive landings defined along a first surface of the interconnect structure opposite a second surface coupled with the second substrate. The joining may include bonding the plurality of conductive studs to the plurality of conductive landings. In some embodiments the interconnect structure may include third conductive contacts. The methods may further include forming a second semiconductor active device structure overlying a third substrate. The second semiconductor active device structure may include fourth conductive contacts. The methods may also include joining the third substrate with the second substrate. The joining may include coupling the fourth conductive contacts with the third conductive contacts.

Embodiments of the present technology may also include methods of forming an interconnect structure. The methods may include forming a reverse interconnect structure for one or more active devices over an interconnect substrate. The reverse interconnect structure may include a conductive material formed within a plurality of layers of dielectric material. The methods may include forming a plurality of vias along a first surface of the reverse interconnect structure opposite a second surface adjacent the interconnect substrate. The vias may provide access to the conductive material. The methods may include lining each via of the plurality of vias with the conductive material. The methods may also include at least partially filling each via with a conductive filler material.

In some embodiments, the methods may also include positioning a plurality of conductive extensions of a first semiconductor active device within a subset of the plurality of vias. The methods may include melting the conductive filler material to electrically couple the conductive extensions of the first semiconductor active device with the conductive material of the reverse interconnect structure. The methods may include positioning a plurality of conductive extensions of a second semiconductor active device within a second subset of the plurality of vias. The methods may also include melting the conductive filler material within the second subset of the plurality of vias to electrically couple the conductive extensions of the second semiconductor active device with the conductive material of the reverse interconnect structure. The methods may also include planarizing the first surface of the reverse interconnect structure to limit the conductive filler material to be within the plurality of vias.

Embodiments of the present technology also encompass methods of forming an interconnect structure. The methods may include forming a reverse interconnect structure for one or more active devices over an interconnect substrate. The reverse interconnect structure may include a conductive material formed within a plurality of layers of dielectric material. The methods may also include forming a plurality of contact landings along a first surface of the reverse interconnect structure opposite a second surface adjacent the interconnect substrate. The contact landings may provide access to the conductive material. Each contact landing of the plurality of contact landings may be sized larger than a corresponding conductive extension of one or more semiconductor active device structures.

In some embodiments the contact landings may extend beyond a dielectric material defining the first surface of the reverse interconnect structure. The methods may also include positioning a plurality of conductive extensions of a semiconductor active device adjacent the plurality of contact landings. The methods may also include bonding the plurality of conductive extensions to the plurality of contact landings to electrically couple the conductive extensions of the semiconductor active device with the conductive material of the reverse interconnect structure. The reverse interconnect structure may extend beyond the lateral dimensions of the semiconductor active device.

Such technology may provide numerous benefits over conventional systems and techniques. For example, by decoupling the interconnect structure from the active device footprint, increased sizing of interconnect wires and vias may be formed, which may improve device performance. Additionally, fewer metal layers may be required at the back end, reducing overall conductive lengths across and through a device. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During back-end-of-line processing, metal and other conductive materials may be filled into layers of structures on a substrate. As transistor structures continue to shrink, and aspect ratios continue to increase, the interconnect lines continue to shrink as well. Because of the properties of the conductive materials typically used in fabrication, as the wires, traces, and vias reduce in size, their line resistance tends to increase. Taken on a scale of typical integrated circuits that can have many miles of interconnect wiring, slight increases in line resistance can lead to unacceptable performance drops.

Moreover, the typical fabrication process may further limit production. For example, device fabrication often includes forming interconnect structures vertically over active device layers. After transistor, memory, or other device structures have been formed, metallization may begin be forming interconnect structures through overlying layers of dielectric material. As device density continues to increase on a wafer, while the device footprint continues to shrink, more layers of metal, and hence longer conductive paths may be produced, negatively impacting device performance. The fabrication process may include any number of metal layers connecting active device layer structures. Intermediate metallization may then be formed, followed by semi-global and lastly global wiring, with each section vertically built over underlying layers. In this way, all wiring may be limited to the active device footprint.

To accommodate some of these losses, some techniques utilize fan-out interconnect structures in which additional layers of metal are formed in an epoxy mold compound allowing the metal contacts to extend slightly beyond the footprint of the active device. Although providing additional space for wafer level packaging, this technique may produce issues as well. For example, the additional metallization, called redistribution layers, adds additional layers of metal, further increasing the conductive path lengths and number of metal layers. Additionally, the epoxy mold compound is often characterized by a different coefficient of thermal expansion than silicon structures to which it is in contact. Accordingly, heating of the structures can cause differing amounts of stress between the layers, causing bending and other sheer forces across the devices.

The present technology may overcome these and other issues by forming an interconnect structure on a separate substrate from the active device. Although the active device may include one or more metal layers, much of the global wiring may be performed on a separate substrate. By decoupling the interconnect structure from the active device substrate, the interconnects may not be limited to the active device footprint. This may allow a natural fan-out process to be performed without requiring additional layers of metallization, epoxy mold compound, or redistribution layers. Accordingly, improvements in device performance may be provided as well as additional capabilities for coupling multiple active devices to a single fan-out interconnect substrate.

Although the remaining disclosure will routinely identify specific interconnect structures according to the disclosed technology, it will be readily understood that the systems and methods are equally applicable to a variety of other products, processes, and systems. Accordingly, the technology should not be considered to be so limited as for use with fan-out interconnect processes alone. The disclosure will discuss an exemplary process for producing structures according to the present technology before providing exemplary structures that may be developed and encompassed by the present technology.

Figure 1:
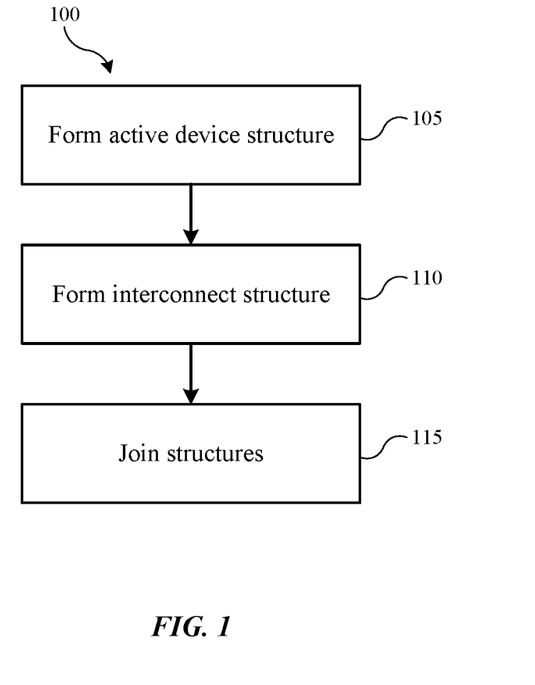
FIG. 1 illustrates exemplary operations in a method of forming a fan-out interconnect structure according to some embodiments of the present technology.

FIG. 1 illustrates exemplary operations in a method 100 of forming a fan-out interconnect structure according to some embodiments of the present technology. The method may include additional operations prior or subsequent to the listed operations, and may also include additional operations within the method. Method 100 may include forming a semiconductor active device structure at operation 105. The semiconductor active device structure may be formed overlying a first substrate, and may include forming first conductive contacts. Method 100 may also include forming an interconnect structure overlying a second substrate at operation 110. The interconnect structure may include second conductive contacts.

At operation 115, the method may include joining the first substrate with the second substrate. The joining at operation 115 may be performed in a number of ways as will be described with reference to the remaining figures, and may include electrically or mechanically coupling the first conductive contacts with the second conductive contacts. By performing operations of method 100, the interconnect structure of the overall device may extend beyond the lateral dimensions of the semiconductor active device structure. In this way, the present technology may decouple the active device structure from the interconnect structure, which may allow a fan-out interconnect structure to be formed with the metallization layers themselves, instead of developing an additional redistribution layer of traditional fan-out techniques.

Figure 2A:
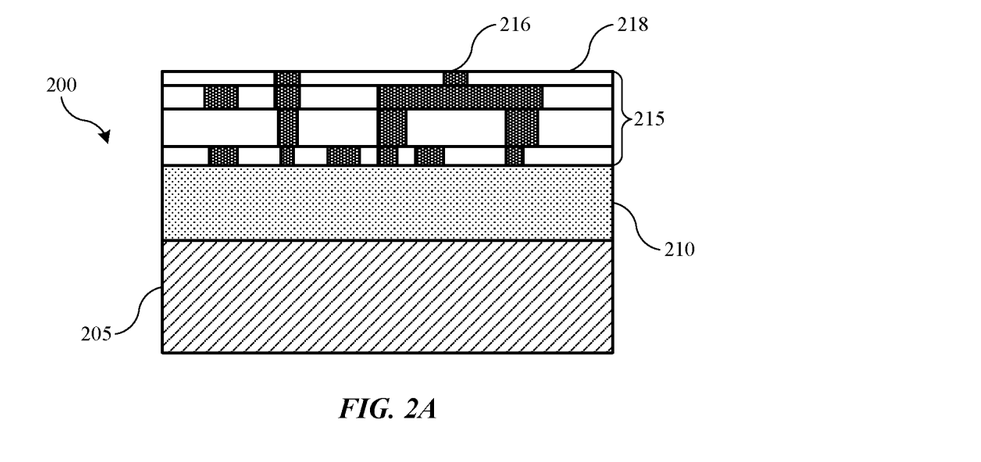
FIGS. 2A-2B show schematic cross-sectional views of exemplary substrates formed according to some embodiments of the present technology.
Figure 2B:
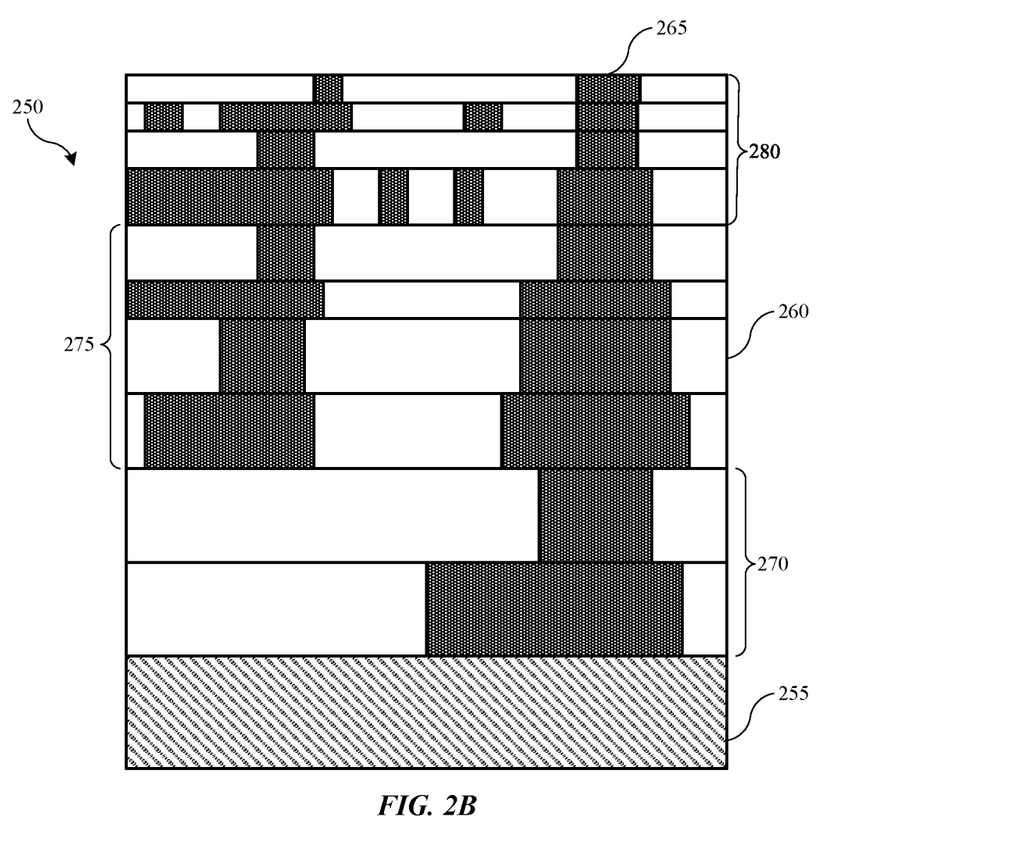

Turning to FIGS. 2A-2B is shown schematic cross-sectional views of exemplary substrates formed according to some embodiments of the present technology. FIG. 2A shows an exemplary semiconductor active device structure 200 according to some embodiments of the present technology. It is to be understood that the illustrated structure is not intended to be limiting, but may show aspects of a variety of structures encompassed by the present technology. As shown, semiconductor active device structure 200 may be formed over a first substrate 205. First substrate 205 may be a silicon-containing material, a germanium-containing material, or any other material over which semiconductor active device structures may be formed.

Active device level 210 may include any number of materials or structures that may be formed in semiconductor fabrication. For example, active device level 210 may include analog or digital structures, transistor structures of any form, memory structures of any form, and may include any two-dimensional or three-dimensional structure formed in semiconductor fabrication. Accordingly, active device level 210 is merely representative of a group of structures that may be formed over first substrate 205, although no particular materials are illustrated. It is to be understood that any number of materials may be incorporated within this layer as would be understood by the skilled artisan. Similarly, active device layer 210 may not be representative of the thickness of some active structures that may be encompassed by active device layer 210. For example, while two-dimensional transistor structures may have a relatively thin cross-section, three-dimensional memory structures may have many stacked levels. Regardless, any of these or any other semiconductor active materials are encompassed by active device layer 210 as may be developed in front-end processing operations.

Semiconductor active device structure 200 may also include a metallization layer 215 overlying the semiconductor active device layer 210. In many different semiconductor structures, metallization may be formed in structured layers to interconnect various components formed over substrate 205. The metallization may include a series of layers of dielectric material 218, such as interlayer dielectric or some other insulative material, stacked vertically. Within the layers of dielectric materials may be a conductive material 216 formed in various wires and vias to provide conductive pathways for powering aspects of the semiconductor active layer 210 in any number of ways. The metallization layers may include any number of metals or conductive materials including copper, tungsten, cobalt, or any other conductive materials that may be used in semiconductor interconnect formation.

Metallization layer 215 may include any number of metal layers formed as part of the semiconductor active device structure 200. For example, depending on the complexity and layout of the active device layer 210, a number of base metal layers may be formed, as would be understood by the skilled artisan. For example, exemplary semiconductor active device structures may include greater than or about 1, greater than or about 2, greater than or about 3, greater than or about 4, greater than or about 5, greater than or about 6, greater than or about 7, greater than or about 8, greater than or about 9, greater than or about 10, greater than or about 12, greater than or about 15, or more layers of dielectric material 218 with conductive material 216 disposed in different patterns within each layer depending on interconnect structures. It is to be understood that metallization layer 215 may include any one or more of these layers.

In many back-end fabrication processes, metallization is formed in groups commonly termed the initial metal layers, intermediate layers, semi-global layers, and global layers of interconnect wiring. Often, these layers increase in thickness as they extend from the active device layer. In traditional fabrication, these layers are formed each overlying the previous, while all being maintained within the footprint of the active device layer or substrate region. As device size shrinks, and device layouts increase in complexity, these interconnects may be formed closer and closer together through more and more layers. Fan-out interconnect designs are often implemented due to the close proximity of global wiring, creating difficult landings for wafer level packing bumping or ball grid arrays. As previously discussed, however, these traditional fan-out interconnect structures often form several more layers of metal that only extend beyond the footprint of the active device layers at this stage, commonly termed the redistribution layers.

The present technology may overcome these issues by halting the vertical interconnect formation structure prior to reaching the final global layers. Because different structures may include a different number of metal layers, the present technology may form one or more metal or intermediate layers within metallization layer 215 overlying the active device layer 210. In some embodiments, the metallization layers on substrate 205 may be formed in a standard process in which metal layers are formed sequentially followed by intermediate layers. Although semi-global and/or global layers of interconnects may also be formed overlying the structure in some embodiments, in other embodiments these layers may not be included within the semiconductor active device structure.

Although the number of metal layers formed overlying the active device layer may vary based on the structures formed, the number of metal layers required, and other parameters, the layers may be formed to a level according to certain parameters. For example, in some embodiments, the metallization may be formed to a level where formed vias are characterized by a diameter of greater than or about 200 nm, greater than or about 500 nm, greater than or about 750 nm, greater than or about 1 µm, greater than or about 2 µm, greater than or about 3 µm, greater than or about 4 µm, greater than or about 5 µm, greater than or about 6 µm, or more. This may be based on the precision and accuracy of pick-and-place equipment as will be explained below, for example. Additionally, the number of levels of metallization included in metallization layer 215 may be based on other factors, such as the number of layers that may be readily formed within the active device layer footprint.

The remaining interconnect layers may be formed on a separate substrate as illustrated in FIG. 2B. As shown in the figure, interconnect structure 250 may be formed overlying substrate 255 separately from the active device structures formed over substrate 205. Substrate 255 may be a fan-out interconnect wafer, and may include any number of different materials, including glass or carrier materials, wafers or substrates similar to substrate 205, or other conductive substrates such as interposers or other substrates with conductive materials formed through the structure, where wafer level packaging, such as solder bumps, may be directly coupled with a backside of substrate 255. Overlying the opposite side of substrate 255 may be the rest of the interconnect structure for semiconductor active device structure 200.

Interconnect structure 250 may include a number of interconnect layers of dielectric material 260, such as interlayer dielectric material or other insulative materials, having conductive material 265 disposed in patterns for producing conductive paths for the active device structure. The interconnect structure may be formed in reverse compared to a traditional formation. For example, directly overlying substrate 255 may be the uppermost global interconnect wiring, which may include a number of layers 270, followed by the semi-global layers 275, and intermediate layers 280. Interconnect structure 250 may include any of the initial metal layers as well, or some of the metal layers and/or intermediate layers may be split between the active device structure 200 over substrate 205 and the interconnect structure over substrate 255. In this reverse process, the global wiring may be formed prior to the semi-global wiring, which may be formed prior to the intermediate wiring if included, which may be formed prior to the initial metal layers if included.

Substrate 255, which may be a fan-out interconnect wafer, may not be sized similarly to substrate 205. For example, substrate 255 may be larger or smaller than substrate 205 in embodiments, which may allow increasing or decreasing in structure sizes compared to traditional, strictly vertical interconnect formation over active layers. Substrate 255 may be at least about 5% larger than substrate 205, and in some embodiments substrate 255 may be at least about 10% larger than substrate 205, at least about 20% larger, at least about 30% larger, at least about 40% larger, at least about 50% larger, at least about 60% larger, at least about 70% larger, at least about 80% larger, at least about 90% larger, at least about 100% larger, at least about 200% larger, or more. For example, as will be discussed further below, multiple semiconductor active device structures may be joined with a single interconnect structure 250 in some embodiments, such as to create system-in-package structures or other multi-component devices. Accordingly, substrate 255 may be any size to accommodate the number of structures required for a given end device. The uppermost or exposed layer of one or both of structures 200 and 250 may be formed to accommodate the joining operation 115, in which structure 200 is coupled with structure 250. For example, the uppermost layer of structure 200 may include the first conductive contacts, and the uppermost layer of structure 250 may include the second conductive contacts. The following figures will describe exemplary first and second conductive contacts as well as exemplary coupling processes.

FIGS. 3A-3D show schematic cross-sectional views of exemplary interconnect structure 300 developed according to some embodiments of the present technology. Interconnect structure 300 may include any of the structures or layers of interconnect structure 250 previously discussed, and may include coupling for multiple active device structures. Although a single structure will be described, it is to be understood that interconnect structure 300 may include tens, hundreds, thousands, millions, or more such structures, each configured to accommodate an active device structure or a specific first conductive contact of a single active device structure. Interconnect structure 300 may include a substrate 305 over which a reverse interconnect structure 310 may be formed through dielectric material 315 as previously described. Depending on the type of substrate, and whether substrate 305 is intended to be incorporated within the final device structure, an additional layer 307 may be included for attachment and removal of substrate 305. In some embodiments layer 307 may not be included, such as where a ball grid array or other wafer level packaging is performed on the backside of substrate 305 as previously discussed.

Figure 3A:
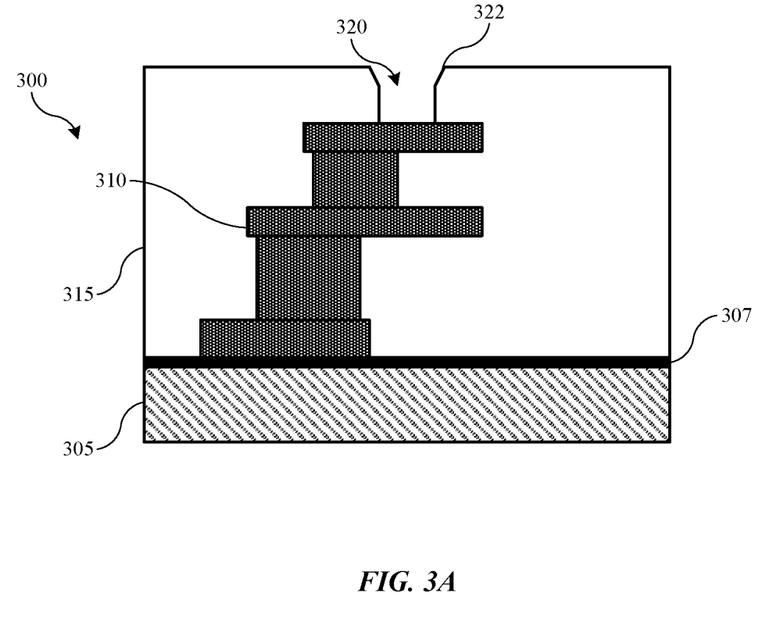
FIGS. 3A-3D show schematic cross-sectional views of exemplary interconnect structures developed according to some embodiments of the present technology.

As illustrated in FIG. 3A, interconnect structure 300 may include a receptacle as the second conductive contact configured to accommodate an active device structure having a first conductive contact. The second conductive contact may be or include a via 320 defined through dielectric material 315 at a first surface of interconnect structure 300 opposite a second surface adjacent to or coupled with substrate 305. In some embodiments, an additional layer of dielectric material 315 may be formed overlying an uppermost level of wiring or interconnect material 310. The via may be etched with any number of processes including wet etches, dry etches, reactive-ion etching, or other etching or removal operations that may be used to produce a via 320. Via 320 may be formed to access a top layer of interconnect structure 310. In some embodiments a plurality of vias may be formed across a surface of interconnect structure 300, which may provide multiple second conductive contacts. Via 320 may be characterized by any number of shapes including straight sidewalls. In some embodiments as illustrated, via 320 may be characterized by a tapered access 322, which may be or include a chamfered or beveled edge to via 320. As will be discussed below, tapered access 322 may provide compliance for positioning an active device structure during the joining process. The tapered access 322 may be defined from the first surface of the interconnect structure 300, such as through dielectric material 315, and may partially or fully extend through the via 320.

Figure 3B:
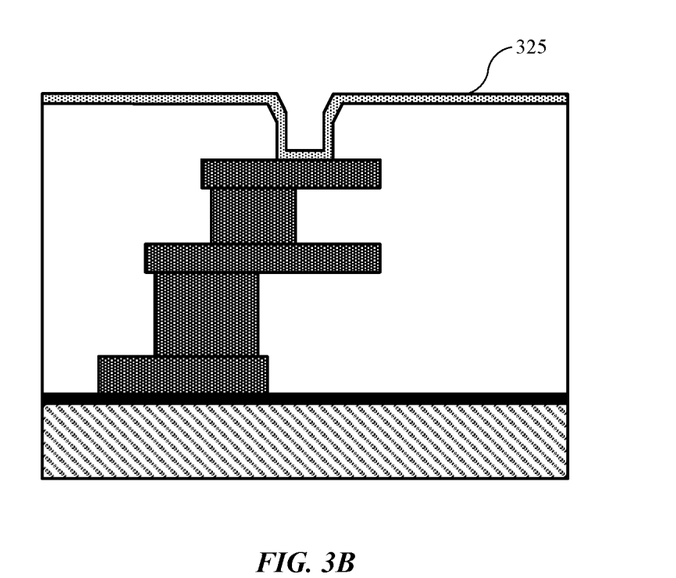
Figure 3C:
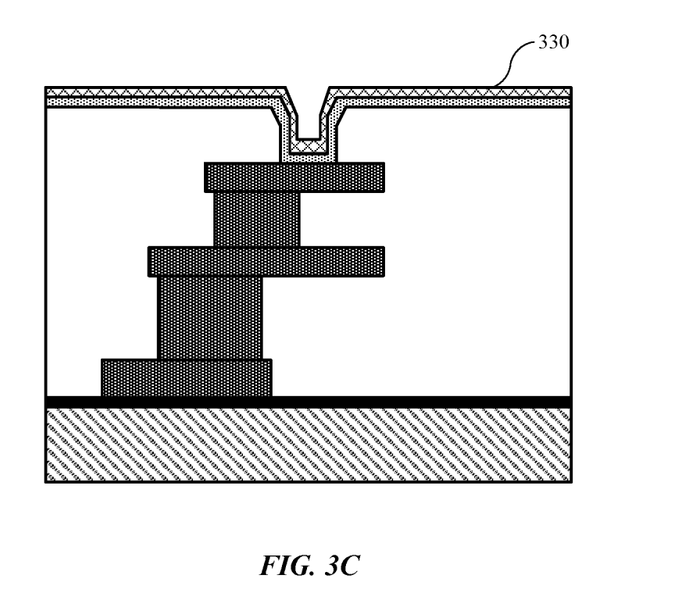

Once the plurality of vias 320 have been formed, a conductive liner 325 may be formed across interconnect structure 300 as illustrated in FIG. 3B. Conductive liner 325 may be the same material as the interconnect material, or may be different in embodiments. For example, conductive liner 325 may be any of the metals previously noted, as well as other conductive materials that may facilitate transfer between an active device structure and the interconnect structure 300. Once the liner has been deposited, a conductive filler 330 may be deposited over the liner across the first surface of the interconnect structure 300, as illustrated in FIG. 3C. Conductive filler 330 may be any number of materials, and in some embodiments, may be a conductive material characterized by a relatively low melting point. For example, conductive filler 330 may be a solder or other material that may be melted to join or bond first conductive contacts of an active device within vias 320 of the interconnect structure. In exemplary embodiments, conductive filler 330 may include lead, tin, or some other material or set of materials to provide a material characterized by a melting point less than or about 200° C. In some embodiments, the conductive filler may be characterized by a melting point less than or about 180° C., less than or about 160° C., less than or about 140° C., less than or about 120° C., less than or about 100° C., less than or about 80° C., less than or about 60° C., less than or about 50° C., or less.

Figure 3D:
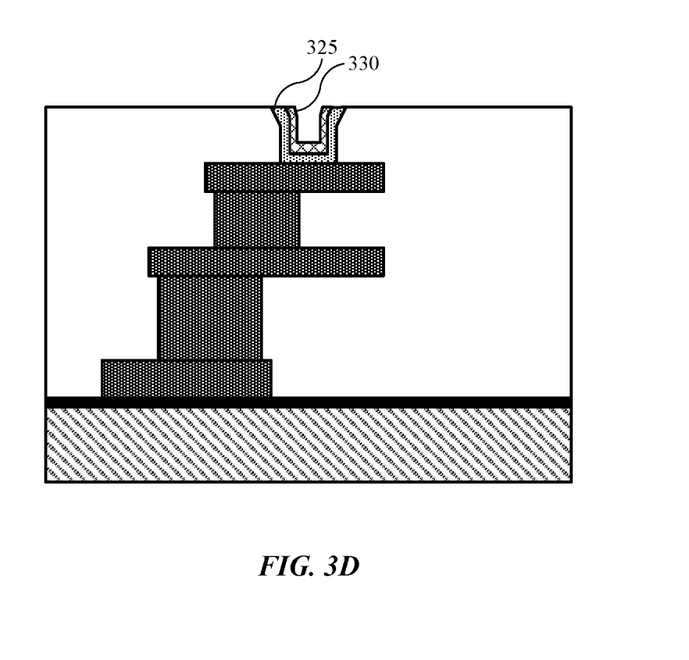

The conductive filler 330 may be part of or may be the second conductive contacts in some embodiments, as the conductive filler may be the material directly contacting, coupling, bonding, or otherwise joining the metallization between the active device structure and the interconnect structure. Conductive filler 330 may not completely fill vias 320 in embodiments in order to limit or prevent flow of the conductive filler 330 out from the vias 320 during the joining operation. Accordingly, in some embodiments, conductive filler 330 may only partially fill vias 320. The conductive liner 325 and conductive filler 330 may be formed or deposited by any number of known operations including chemical or physical deposition, plating, or electrically-based deposition techniques, for example. Once the conductive filler has been deposited or formed within the vias 320, a polishing operation, such as a chemical-mechanical polishing, may be performed to remove one or both of the conductive filler 330 or the liner 325 from the first surface of the interconnect structure as illustrated in FIG. 3D. By performing a polishing operation, a substantially planar surface may be provided for subsequent device joining. Once conductive filler has been formed within the plurality of vias 320, the interconnect structure may be capable of receiving an active device structure having additional conductive extensions in a pattern similar to the plurality of vias 320.

Figure 4A:
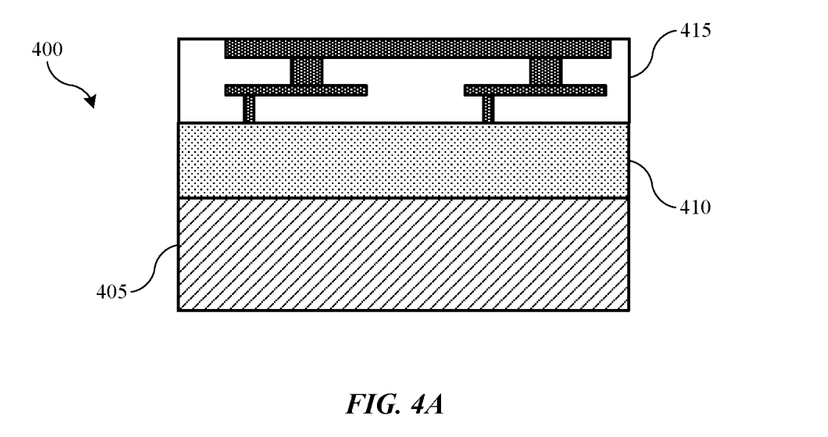
FIGS. 4A-4F show schematic cross-sectional views of exemplary active device structures according to some embodiments of the present technology.
Figure 4B:
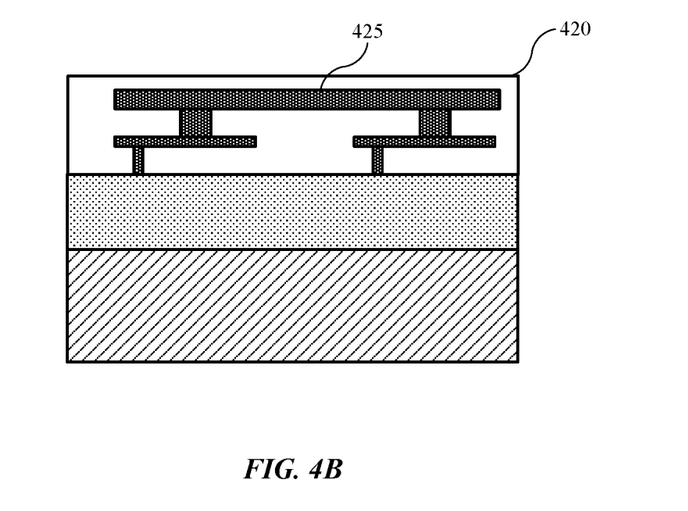

FIGS. 4A-4F show schematic cross-sectional views of exemplary active device structure 400 according to some embodiments of the present technology. Active device structure 400 may be similar to active device structure 200 previously described. For example, active device structure 400 may include a substrate 405 over which an active device layer 410 may be formed as illustrated in FIG. 4A. As previously discussed, active device layer 410 may be or include any number of semiconductor structures. One or more metallization layers 415 may be formed overlying the active device layer 410, and may include any number of metal or intermediate layers of metal. The structure may be polished to produce a planar structure. Subsequent formation of a particular interconnect metal structure, a dielectric material, such as interlayer dielectric 420 may be extended above the interconnect material 425, as illustrated in FIG. 4B.

Figure 4C:
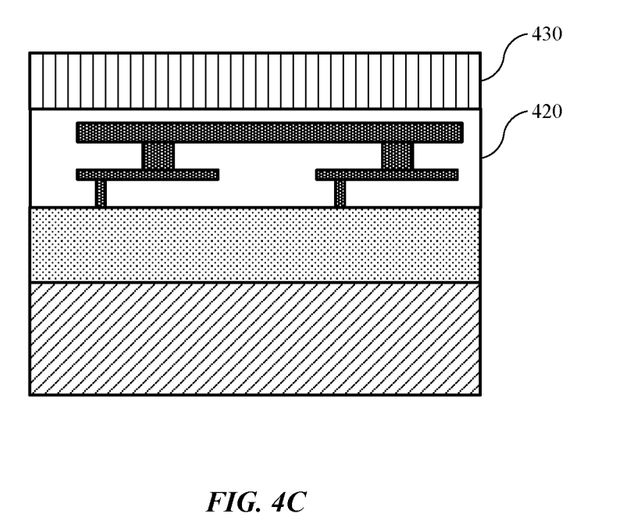
Figure 4D:
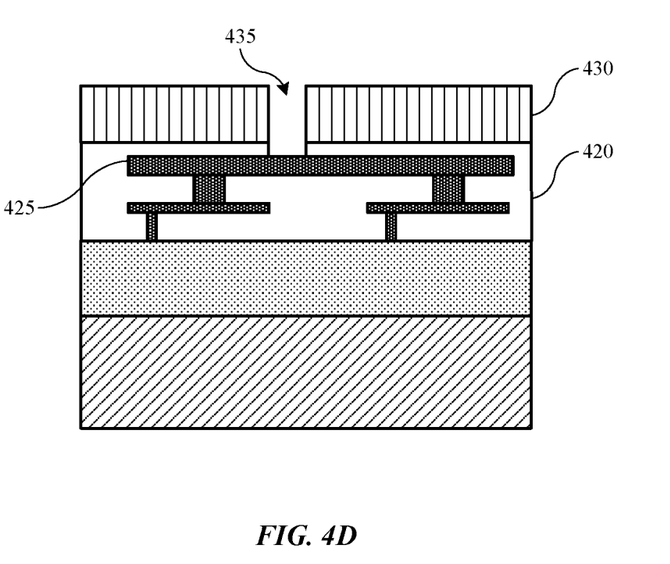
Figure 4E:
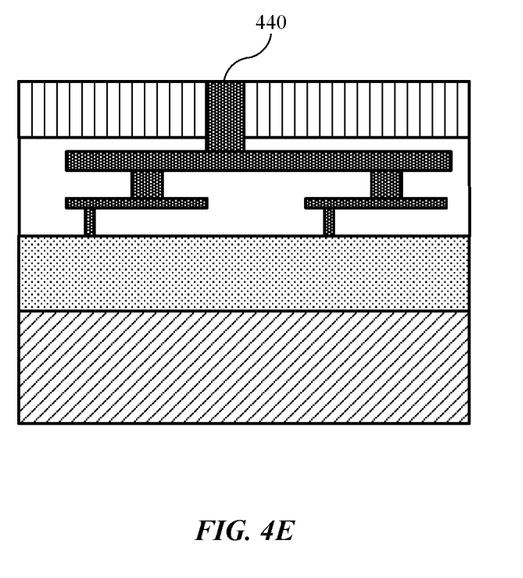

As shown in FIG. 4C, a sacrificial layer 430 may be formed overlying the dielectric 420. Sacrificial layer 430 may be a photoresist, a dielectric, or some other material that may be patterned. A pattern may be applied to the sacrificial layer 430, and a number of vias 435 may be formed through the sacrificial layer 430 and the underlying dielectric material 420, as illustrated in FIG. 4D. The vias 435 may access the interconnect material 425 at multiple locations although only a single via is illustrated. Additional conductive material may be deposited within the vias to produce a plurality of conductive extensions 440 or studs extending from the active device structure as shown in FIG. 4E. In embodiments the conductive studs may be formed corresponding to a pattern of receptacles or contact landings formed on an interconnect wafer as described with regard to other figures. Conductive extensions 440 may be the same material as the interconnect material 425, or may be a different conductive material in some embodiments, and may be any of the materials previously described.

Figure 4F:
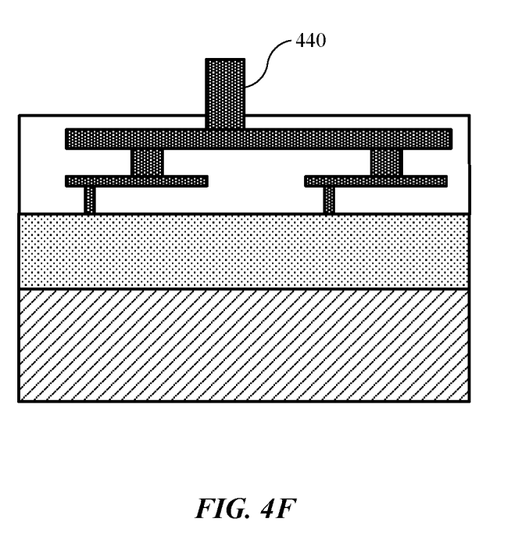

The deposition or formation may include a number of operations depending on the material used. As one non-limiting example, copper extensions may be formed in one embodiment, although any other conductive metal or material may similarly be used. A metal liner may first be formed within the via 435 before an electrochemical deposition is performed to fill via 435 with metal. A chemical-mechanical polishing operation may then be performed to planarize the surface of the active device structure, and remove residual material from the surface of the device structure. This may also aid in producing a substantially uniform height for the plurality of conductive extensions 440 formed across the surface of the active device, which may include tens, hundreds, or thousands of such conductive extensions 440. Once the conductive extensions have been formed, the sacrificial material 430 may be removed to expose a plurality of extensions 440 extending from a first surface of the active device structure opposite a surface in contact with substrate 405, as illustrated in FIG. 4F.

Figure 5A:
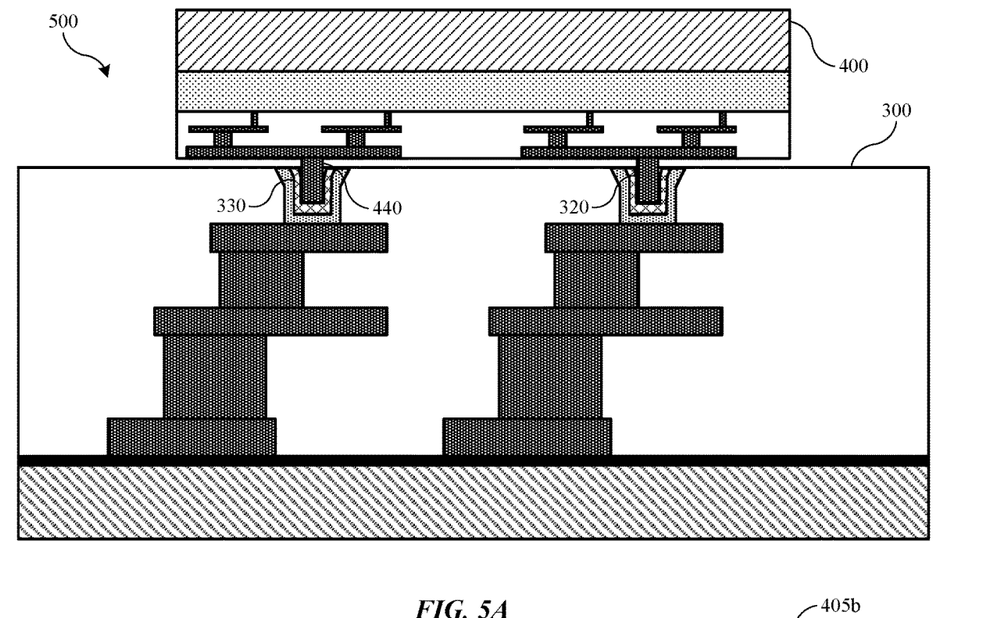
FIGS. 5A-5B illustrate schematic cross-sectional views of exemplary fan-out interconnect structures according to embodiments of the present technology.
Figure 5B:
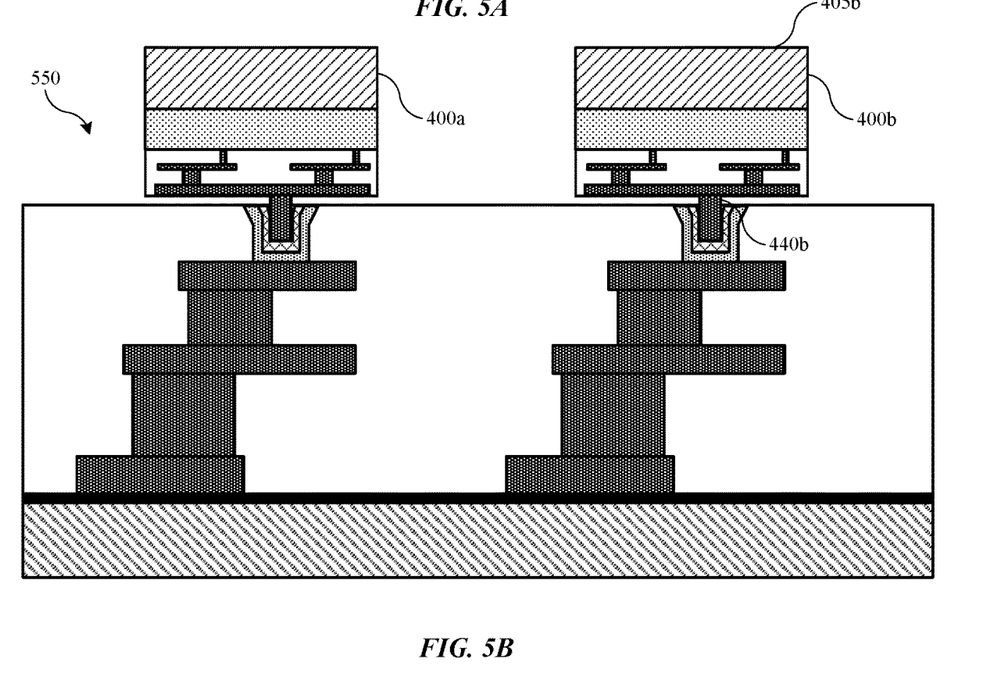

After formation of the active device structure and the interconnect structure, as well as the formation of the first conductive contacts and the second conductive contacts, the two structures may be joined. FIGS. 5A-5B illustrate schematic cross-sectional views of exemplary fan-out interconnect structures according to embodiments of the present technology. The figures include structures, such as structures 300 and 400, although any other structures described throughout the present technology are similarly encompassed. FIG. 5A illustrates a first fan-out interconnect structure 500 in which a semiconductor active device structure 400 may be inverted and joined with an interconnect structure 300. As shown, conductive extensions 440 may be positioned within vias 320 to contact conductive filler 330. In some embodiments, the placement of the active devices may be part of an automated process. Active device structures may include alignment marks, which may be utilized by a pick-and-place machine, for example, to properly orient the active device such that each conductive extension 440 is properly aligned with a corresponding via 320. Because of limits of accuracy of fabrication tools, vias 320 may be characterized by a diameter or lateral distance between sidewalls that is larger than a diameter or lateral distance across the conductive extensions. For example, a diameter of vias 320 may be at least about 5% larger than a diameter of conductive extensions 440, and in some embodiments the diameter of the vias may be at least about 10% larger, at least about 20% larger, at least about 30% larger, at least about 40% larger, at least about 50% larger, at least about 60% larger, at least about 70% larger, at least about 80% larger, at least about 90% larger, at least about 100% larger, at least about 150% larger, at least about 200% larger, or more depending on the dimensions of the conductive extensions 440.

Once the active device 400 is properly positioned with the interconnect structure 300, a heating operation may be performed to melt the conductive filler 330. Once melted, the conductive filler may flow or reflow around the conductive extensions 440 to provide a three-dimensional, and 360° coupling with the conductive extensions 440, which may electrically couple the active device with the interconnect device through the conductive filler. As an additional benefit, when the conductive filler 330 melts, surface tension of the liquid material may help pull the active device properly into position, and adjust for any misalignment of the active device. The tapered access of the vias 320 may also accommodate displacement error of the active device positioning, to avoid damage to the structures. This may also facilitate seating of the active device within the vias 320. The active device may or may not fully seat against the interconnect structure in embodiments. For example, although direct contact of the dielectric materials may occur, in some embodiments a gap may be maintained between the two dielectric materials of the two structures.

FIG. 5B illustrates coupling a second active device 400b to the interconnect structure 300 to produce device 550. The second active device 400b may be the same or different from first active device 400a, and second active device 400b may include a structure formed over a third substrate 405b, and having fourth conductive contacts, which may be additional conductive extensions 440b. As illustrated, interconnect structure 300 may include additional vias as third conductive contacts patterned for corresponding conductive extensions of second active device 400b. In some embodiments either active device structure 400 may be any of the semiconductor structures previously noted, and interconnect structure 300 may be configured to accommodate any number of such active devices to produce a number of final devices including system-in-package designs. Once the active devices have been placed, reflow of the conductive filler 330 may be performed to couple and seat the active devices within the interconnect structure.

As illustrated in both FIGS. 5A and 5B, interconnect structure 300 may be formed on a larger footprint than the active devices, which may allow the interconnects to extend beyond the footprint, in a fan-out interconnect structure. Unlike traditional fan-out structures, the illustrated structures may not include redistribution layers, which may reduce the overall number of metal layers formed for the device. This may reduce conductive path length, reduce line resistance, and improve overall performance. Epoxy materials may also be limited or not included in the structure, which may reduce or limit discrepancies of thermal performance of the materials. Additionally, testing of the active devices may be performed earlier during fabrication, to ensure proper functionality prior to further metallization or interconnect formation. Still more benefits may include compliance for heat differences during performance. For example, active devices may increase in heat during operation causing swelling or movement of active device structures 400. By maintaining a vertical offset between the active device structures 400 and the interconnect structures 300, thermal expansion and strain may be absorbed by the conductive extensions, which may allow for deflection by the conductive extensions without sheer stress on the overall device structure.

Figure 6A:
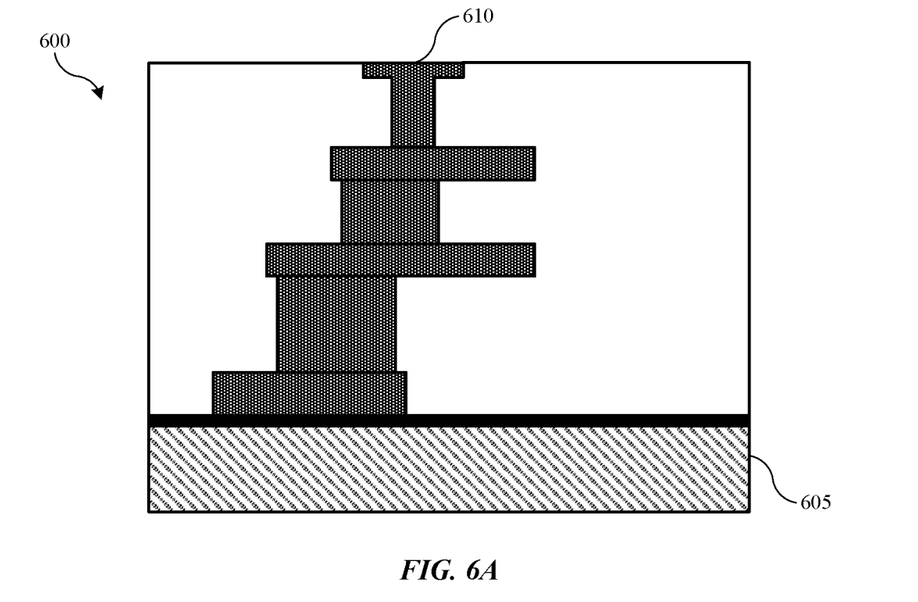
FIGS. 6A-6B show schematic cross-sectional views of exemplary interconnect structures developed according to some embodiments of the present technology.
Figure 6B:
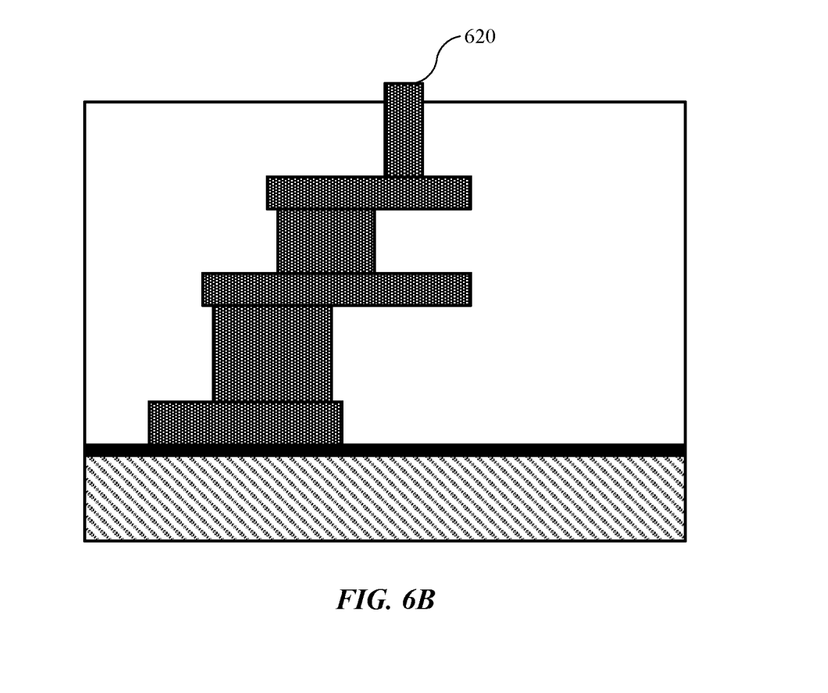

FIGS. 6A-6B show schematic cross-sectional views of exemplary interconnect structure 600 developed according to some embodiments of the present technology. Structure 600 may include any of the materials of interconnect structure 300 previously described, but may show an alternative configuration of second conductive contacts. For example, as illustrated in FIG. 6A, instead of forming receptacles in which conductive extensions may be disposed, structure 600 may form contact landings 610 along a first surface of the interconnect structure opposite a second surface adjacent to or coupled with a substrate 605. Contact landings 610 may be formed by any known techniques and may include similar operations previously described. Contact landings 610 may be filled vias that extend to the first surface, or may have lateral extending contact pads as illustrated to create a larger contact area to accommodate placement error. In some embodiments, the contact landings may be characterized by a diameter larger than corresponding conductive extension diameters. The contact landings 610 may be flush with the first surface, and may have been formed or finished with a polishing operation to ensure vertical uniformity across the plurality of landings.

FIG. 6B illustrates an additional configuration in which conductive extensions 620 are formed extending beyond the first surface of the interconnect structure. Conductive extensions 620 may be formed by a process similar to the conductive extensions 440 previously described. In additional embodiments, either set of conductive extensions may be formed by performing a selective etch to recess the dielectric from filled vias within the interconnect structure.

Figure 7:
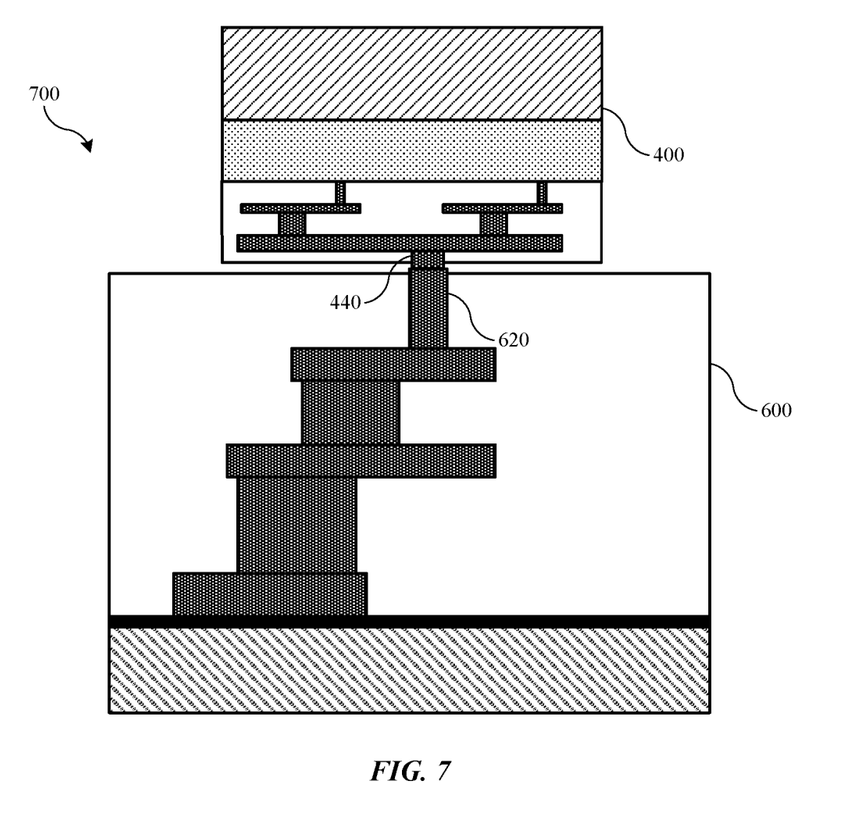
FIG. 7 illustrates a schematic cross-sectional view of an exemplary fan-out interconnect structure according to embodiments of the present technology.

FIG. 7 illustrates a schematic cross-sectional view of an exemplary fan-out interconnect structure 700 according to embodiments of the present technology. Fan-out interconnect structure 700 may illustrate an additional joining operation in which conductive extensions 440 of active device structure 400 are joined with conductive extensions 620 of interconnect structure 600. The extensions may be joined in multiple ways. For example, microbumps may be formed between the two conductive extensions to join the two structures. Additionally, the two conductive extensions may be directly coupled or bonded together. For example, once the active device structure 400 is placed on the interconnect structure 600, the conductive extensions may be bonded with an ultrasonic bonding process in which pressure and/or vibration may be used to create a bonding joint between the two conductive extensions to complete the overall fan-out interconnect structure 700. It is to be understood that structures 500 and 700 are merely examples of coupling schemes encompassed by the present technology, and other joining operations may similarly be performed. By decoupling the interconnect structure from the active device structure according to embodiments of the present technology, fan-out structures may be provided with superior performance and reduced thermal deficiencies over conventional structures.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the material" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a fan-out interconnect structure, the method comprising:
    forming a semiconductor active device structure overlying a first substrate, wherein the semiconductor active device structure comprises first conductive contacts protruding from one or more metallization layers disposed in dielectric material overlying a semiconductor active device layer, wherein the one or more metallization layers form an initial interconnect layer for active devices in the active device layer;
    forming an interconnect structure overlying a second substrate, wherein the second substrate comprises a fan-out interconnect substrate, the interconnect structure comprises second conductive contacts, the interconnect structure comprises a global interconnect layer for the active devices in the active device layer, and the global interconnect layer connects to the fan-out interconnect substrate without a redistribution layer between the global interconnect layer and the fan-out interconnect substrate; and
    joining the first substrate with the second substrate, wherein the joining comprises coupling the first conductive contacts with the second conductive contacts, and wherein the interconnect structure extends beyond lateral dimensions of the semiconductor active device structure.

2. The method of forming an interconnect structure of claim 1, the interconnect structure is formed as a reverse process in which the global interconnect layer is formed on the fan-out interconnect substrate, and a semi-global or intermediate interconnect layer is formed on the global interconnect layer.

3. The method of forming an interconnect structure of claim 1, wherein the first conductive contacts comprise a plurality of conductive studs extending from the dielectric material.

4. The method of forming an interconnect structure of claim 3, wherein a first surface of the interconnect structure opposite a second surface coupled with the second substrate defines a plurality of access vias.

5. The method of forming an interconnect structure of claim 4, wherein each access via is characterized by a taper from the first surface of the interconnect structure.

6. The method of forming an interconnect structure of claim 5, wherein each access via contains a conductive liner.

7. The method of forming an interconnect structure of claim 6, wherein the second conductive contacts comprise a conductive filler contained within the plurality of access vias.

8. The method of forming an interconnect structure of claim 7, wherein the joining further comprises:
    contacting the conductive filler contained within the plurality of access vias with the plurality of conductive studs; and
    heating the conductive filler to cause the conductive filler to melt and flow about the conductive studs to electrically couple the conductive filler with the conductive studs.

9. The method of forming an interconnect structure of claim 3, wherein the second conductive contacts comprise a plurality of conductive landings defined along a first surface of the interconnect structure opposite a second surface coupled with the second substrate.

10. The method of forming an interconnect structure of claim 9, wherein the joining comprises bonding the plurality of conductive studs to the plurality of conductive landings.

11. The method of forming an interconnect structure of claim 1, wherein the interconnect structure comprises third conductive contacts, and wherein the method further comprises:
    forming a second semiconductor active device structure overlying a third substrate, wherein the second semiconductor active device structure comprises fourth conductive contacts; and
    joining the third substrate with the second substrate, wherein the joining comprises coupling the fourth conductive contacts with the third conductive contacts.

12. A method of forming an interconnect structure, the method comprising:
    forming a reverse interconnect structure for one or more active devices over a fan-out interconnect substrate, wherein the reverse interconnect structure comprises a conductive material formed within a plurality of layers of dielectric material to form a global interconnect layer for active devices in an active device layer of a first semiconductor active device, and the global interconnect layer connects to the fan-out interconnect substrate without a redistribution layer between the global interconnect layer and the fan-out interconnect substrate;
    forming a plurality of vias along a first surface of the reverse interconnect structure opposite a second surface adjacent the fan-out interconnect substrate, wherein the vias provide access to the conductive material;
    lining each via of the plurality of vias with the conductive material;
    at least partially filling each via with a conductive filler material;
    positioning a plurality of conductive extensions of the first semiconductor active device within a subset of the plurality of vias, the conductive extensions protruding from one or more metallization layers disposed in dielectric material overlying a semiconductor active device layer of the first semiconductor active device, wherein the one or more metallization layers form an initial interconnect layer for the active devices in the active device layer; and
    melting the conductive filler material to electrically couple the conductive extensions of the first semiconductor active device with the conductive material of the reverse interconnect structure.

13. The method of forming an interconnect structure of claim 12, further comprising:
   positioning a plurality of conductive extensions of a second semiconductor active device within a second subset of the plurality of vias; and
   melting the conductive filler material within the second subset of the plurality of vias to electrically couple the conductive extensions of the second semiconductor active device with the conductive material of the reverse interconnect structure.

14. The method of forming an interconnect structure of claim 12, further comprising planarizing the first surface of the reverse interconnect structure to limit the conductive filler material to be within the plurality of vias.

15. A method of forming an interconnect structure, the method comprising:
   forming a reverse interconnect structure for one or more active devices over a fan-out interconnect substrate, wherein the reverse interconnect structure comprises a conductive material formed within a plurality of layers of dielectric material to form a global interconnect layer for active devices in an active device layer of a first semiconductor active device that is separate from the reverse interconnect structure, and the global interconnect layer connects to the fan-out interconnect substrate without a redistribution layer between the global interconnect layer and the fan-out interconnect substrate; and
   forming a plurality of contact landings along a first surface of the reverse interconnect structure opposite a second surface adjacent the fan-out interconnect substrate, wherein the contact landings provide access to the conductive material, and wherein each contact landing of the plurality of contact landings is sized larger than a corresponding conductive extension of one or more semiconductor active device structures.

16. The method of forming an interconnect structure of claim 15, wherein the contact landings extend beyond a dielectric material defining the first surface of the reverse interconnect structure.

17. The method of forming an interconnect structure of claim 15, further comprising:
   positioning a plurality of conductive extensions of a semiconductor active device adjacent the plurality of contact landings; and
   bonding the plurality of conductive extensions to the plurality of contact landings to electrically couple the conductive extensions of the semiconductor active device with the conductive material of the reverse interconnect structure, wherein the reverse interconnect structure extends beyond lateral dimensions of the semiconductor active device.

18. The method of forming an interconnect structure of claim 1, wherein the interconnect structure forms a fan-out interconnect structure using the global interconnect layer.

19. The method of forming an interconnect structure of claim 1, wherein the first conductive contacts extend from below a top level of the active device structure to protrude above the top level of the active device structure.

20. The method of forming an interconnect structure of claim 1, wherein:
   the one or more metallization layers also form second intermediate interconnect layers for the active devices in the active device layer;
   the interconnect structure further comprises first intermediate interconnect layers for the active devices in the active device layer; and
   a number of the first intermediate interconnect layers is determined based on a size of vias formed for the first conductive contacts.

* * * * *